United States Patent
Hyun et al.

(10) Patent No.: US 8,569,821 B2
(45) Date of Patent: Oct. 29, 2013

(54) SEMICONDUCTOR DEVICES AND METHODS OF FORMING THE SAME

(75) Inventors: Sangjin Hyun, Gyeonggi-do (KR); Yugyun Shin, Seoul (KR); Hagju Cho, Seoul (KR); Hyung-seok Hong, Seoul (KR)

(73) Assignee: Samsung Electronics Co., Ltd. (KR)

( * ) Notice: Subject to any disclaimer, the term of this patent is extended or adjusted under 35 U.S.C. 154(b) by 104 days.

(21) Appl. No.: 13/243,073

(22) Filed: Sep. 23, 2011

(65) Prior Publication Data

US 2012/0012942 A1 Jan. 19, 2012

Related U.S. Application Data

(63) Continuation of application No. 12/559,203, filed on Sep. 14, 2009, now Pat. No. 8,048,787.

(30) Foreign Application Priority Data

Oct. 20, 2008 (KR) .......................... 10-2008-0102538

(51) Int. Cl.
H01L 27/108 (2006.01)
H01L 29/76 (2006.01)
H01L 29/94 (2006.01)
H01L 31/119 (2006.01)

(52) U.S. Cl.
USPC .... 257/310; 257/288; 257/760; 257/E21.027; 257/E21.042; 257/E21.043; 257/E21.051; 257/E21.058; 257/E21.077; 257/E21.227; 257/E21.231; 257/E21.248; 257/E21.267; 257/E21.247

(58) Field of Classification Search
USPC .......... 257/288, 310, 322, 758, 760, E21.027, 257/E21.042, E21.043, E21.051, E21.058, 257/E21.077, E21.227, E21.231, E21.248, 257/E21.267, E21.247
See application file for complete search history.

(56) References Cited

U.S. PATENT DOCUMENTS

| | | | | |
|---|---|---|---|---|
| 5,885,861 | A * | 3/1999 | Gardner et al. ................ | 438/231 |
| 7,745,887 | B2 * | 6/2010 | Kim et al. ...................... | 257/407 |
| 8,048,787 | B2 * | 11/2011 | Hyun et al. ..................... | 438/513 |
| 2005/0006675 | A1 | 1/2005 | Tsunashima et al. | |
| 2007/0134867 | A1 | 6/2007 | Sadd et al. | |
| 2008/0017930 | A1 | 1/2008 | Kim et al. | |
| 2008/0029805 | A1 | 2/2008 | Shimamoto et al. | |

FOREIGN PATENT DOCUMENTS

| | | |
|---|---|---|
| JP | 2001-257344 | 9/2001 |
| JP | 2001-291864 | 10/2001 |
| JP | 2006-157015 | 6/2006 |
| KR | 1020010088450 A | 9/2001 |
| KR | 1020030093803 A | 12/2003 |
| KR | 1020060093618 A | 8/2006 |

* cited by examiner

*Primary Examiner* — David Nhu
(74) *Attorney, Agent, or Firm* — Myers Bigel Sibley & Sajovec, P.A.

(57) ABSTRACT

Provided are a semiconductor device and a method of forming the same. The method may include forming a gate dielectric layer including a plurality of elements on a substrate; supplying a specific element to the gate dielectric layer; forming a product though reacting the specific element with at least one of the plurality of elements; and removing the product.

8 Claims, 4 Drawing Sheets

SEMICONDUCTOR DEVICES AND METHODS OF FORMING THE SAME

CROSS-REFERENCE TO RELATED APPLICATIONS

This application is a continuation of U.S. patent application Ser. No. 12/559,203, filed Sep. 14, 2009 now U.S. Pat. No. 8,048,787 which claims priority under 35 U.S.C. §119 of Korean Patent Application No. 10-2008-0102538, filed on Oct. 20, 2008, the entire contents of which are herein incorporated by reference in their entirety.

BACKGROUND

The exemplary embodiments disclosed herein relate to semiconductor devices and methods of forming the same, and more particularly, to semiconductor devices including a gate structure and the methods of forming the same.

Characteristics of a semiconductor device including an operation characteristic may change according to characteristics of layers constituting the gate structure.

Layers included in each gate structure may have different physical/electrical characteristics according to functions of the layers. However, forming the layers so as to satisfy the different physical/electrical characteristics may cause problems such as process complexity and/or process inefficiency.

SUMMARY

Exemplary embodiments provide a method of forming a semiconductor device. The method may include forming a gate dielectric layer including a plurality of elements on a substrate; supplying a specific element to the gate dielectric layer; forming a product by reacting at least of the plurality of elements to the specific element; and removing the product.

Exemplary embodiments provide a semiconductor device. The semiconductor device may include a substrate; a first gate electrode on the substrate; a first gate dielectric layer disposed between the substrate and the first gate electrode. The first gate dielectric layer comprises fluorine.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF THE EMBODIMENTS

Figure 1:
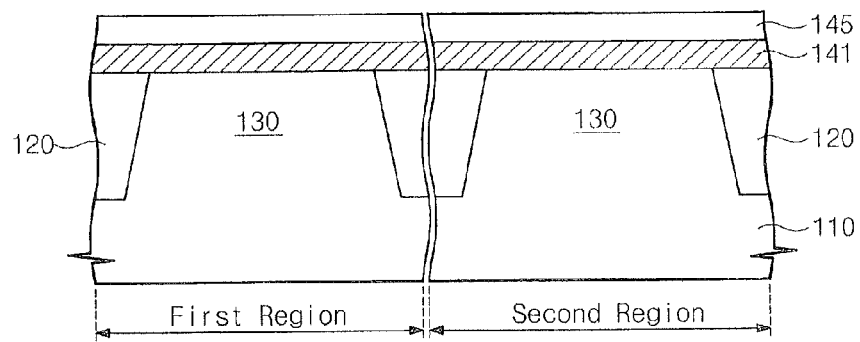
FIGS. 1 through 3 are drawings illustrating a method of forming a semiconductor device according to an embodiment of the present invention.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first region/layer could be termed a second region/layer, and, similarly, a second region/layer could be termed a first region/layer without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Embodiments of the present invention may be described with reference to cross-sectional illustrations, which are schematic illustrations of idealized embodiments of the present invention. As such, variations from the shapes of the illustrations, as a result, for example, of manufacturing techniques and/or tolerances, are to be expected. Thus, embodiments of the present invention should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

In the drawings, the thickness of layers and regions are exaggerated for clarity. It will also be understood that when an element such as a layer, region or substrate is referred to as being "on" or "onto" another element, it may lie directly on the other element or intervening elements or layers may also be present.

Spatially relatively terms, such as "beneath," "below," "above," "upper,", "top,", "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented (rotated 90 degrees or at other orientations) and the spatially relative descriptors used herein interpreted accordingly. As used herein, "height" refers to a direction that is generally orthogonal to the faces of a substrate.

Referring to FIS. 1 through 3, a method of forming a semiconductor device according to an embodiment of the present invention is described. A device isolation layer 120 is formed in a substrate 110 to define an active region 130. The device isolation layer 120 may be formed by filling the trench after forming a trench in the substrate 110, The device isolation layer 120 may be formed of, for example, a silicon oxide layer. The substrate 110 may include a first region and a second region. One of the first and second regions may be a PMOS region and the other may be an NMOS region. A substrate of the first region and a substrate of the second region may include doped regions doped with dopants of different types from each other. In one embodiment, the first region may include a well formed by implanting an n-type dopant and the second region may include a well formed by implanting a p-type dopant. In the other embodiment, the first region may include a well formed by implanting a p-type dopant and the second region may include a well formed by implanting an n-type dopant.

A gate dielectric layer 145 may be formed on the substrate 110. The gate dielectric layer 145 may include a plurality of elements. The gate dielectric layer 145 may have a high dielectric constant compared with a silicon oxide layer. For example, the gate dielectric layer 145 may be formed of a material such as a metal oxide layer, a metal silicon oxide layer or a metal silicon oxynitride layer. More specifically, the gate dielectric layer 145 may be a hafnium silicon oxide layer or a hafnium silicon oxynitride layer. In some embodiments, a buffer dielectric layer 141 may be formed on the substrate 110 beneath the gate dielectric layer 145. For example, the buffer dielectric layer 141 may be a silicon oxide layer.

Figure 2:
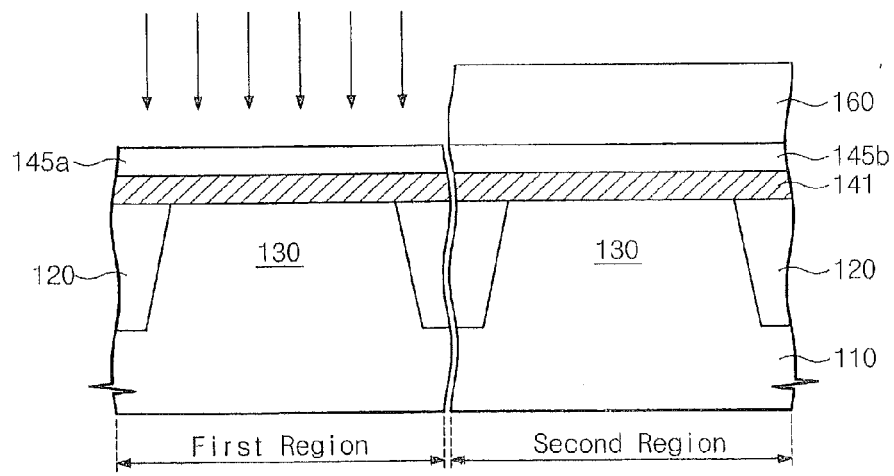

Referring to FIG. 2, a mask pattern 160 may be formed on the gate dielectric layer 145. The gate dielectric layer 145 may include a first gate dielectric layer 145a on the first region and a second gate dielectric layer 145b on the second region. The mask pattern 160 may be formed on the second gate dielectric layer 145b. The first gate dielectric layer 145a may be exposed.

A specific element may be injected into the first gate dielectric layer 145a by an injecting process using the mask pattern 160 as a mask. The specific element may be an element reacting to at least one element among elements constituting the first and second gate dielectric layer 145a and 145b. Also, the specific element may not react to at least another element among elements constituting the first and second gate dielectric layer 145a and 145b. For example, when the first and second gate dielectric layers 145a and 145b include hafnium silicon oxynitride, the specific element may be fluorine (F). The specific element may be injected into the first gate dielectric layer 145a by any one selected from an ion implantation process, a cluster implantation process and an element implantation process including a plasma treatment. The specific element may be injected in an ion state, an atomic state or a state included in a compound.

The specific element reacts to at least one element among elements included in the first gate dielectric layer 145a to form a product. An annealing process may be performed for a reacting of the specific element to the elements in the first gate dielectric layer 145a. The product may be removed from the first gate dielectric layer 145a by the annealing process. A portion of elements which does not reacted to the specific element may remain in the first gate dielectric layer 145a. The product may be substantially removed from the first gate dielectric layer 145a. A portion of the product may also remain in the first gate dielectric layer 145a.

A process condition of the annealing process, for example, a temperature and/or a pressure in a chamber may be controlled according to a vaporization point of the product. When the annealing process is performed, the specific element may be removed in a form of being included in the product or the specific element may be removed from the first gate dielectric layer 145a or in a form of being molecules include the specific element. For example, when the specific element is fluorine (F) and the gate dielectric layer is hafnium silicon oxynitride layer, the fluorine (F) may be removed from the first gate dielectric layer 145a in a form of SiOF or fluorine gas ($F_2$).

Physical and/or electrical characteristics of the gate dielectric layer 145a of the first region and the second gate dielectric layer 145b may become different from each other by a removal of the specific element and/or a product of the specific element. For example, a thickness of the first gate dielectric layer 145a may become smaller than a thickness of the second gate dielectric layer 145b. An atomic ratio of elements in the first gate dielectric layer 145a may become different from an atomic ratio of elements in the second gate dielectric layer 145b. That is, when the first and second gate dielectric layers 145a and 145b include silicon, oxygen and metal element, atomic ratios of silicon and/or oxygen of the first gate dielectric layer 145a may be lower than atomic ratios of silicon and/or oxygen of the second gate dielectric layer 145b.

A difference between atomic ratios of the first and second gate dielectric layers 145a and 145b may be controlled by a state when a specific element is injected (e.g., an ion state, a plasma state or a state included in compound), a quantity of a injected specific element and/or a condition of an annealing process. For example, when the specific element is sufficiently injected to completely remove silicon and/or oxygen elements included in the first gate dielectric layer 145a, the first gate dielectric layer 145a may have conductivity. After performing the annealing process, a portion of the specific elements may remain in the first gate dielectric layer 145a.

As described above, the gate dielectric layer 145 may include portions having different layer characteristics by selectively supplying a specific element to a portion of the gate dielectric layer 145. According to some conventional approaches, a process of forming a layer by performing at least two processes may be necessary so as to form layers having different characteristics from each other in the two regions. However, in some embodiments, since layers having different characteristics from each other may be formed without forming an additional layer, process efficiency may be improved.

Figure 3:
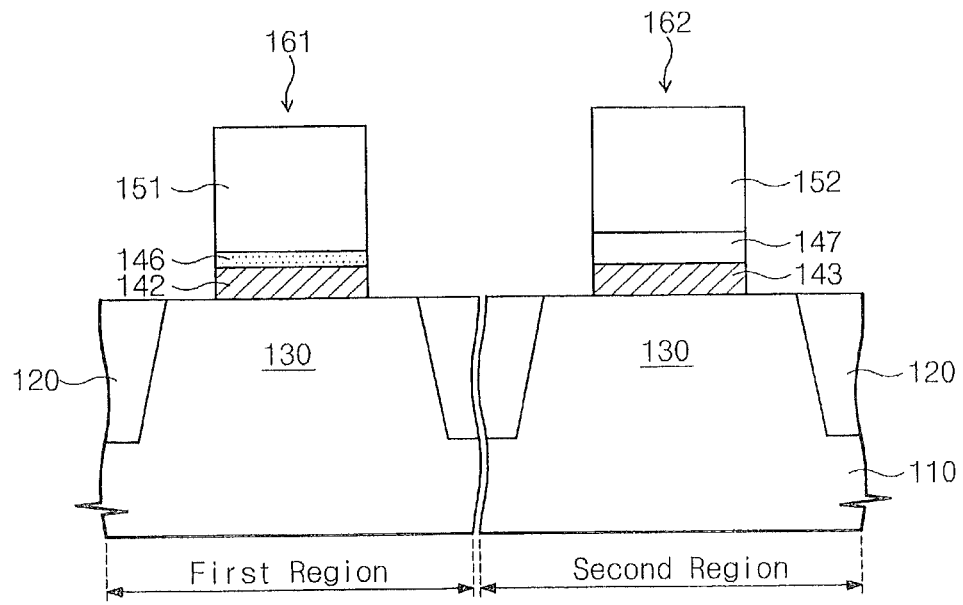

Referring to FIG. 3, a gate conductive layer (not shown) may be formed on the first and second gate dielectric layers 145a and 145b. The gate conductive layer may include doped polysilicon, metal or metal compound. An interface characteristic between the conductive layer and the first gate dielectric layer 145a may be different from an interface characteristic between the conductive layer and the second gate dielectric layer 145b by different atomic ratios of the elements in the first and second gate dielectric layers 145a and 145b.

The first and second gate dielectric layers 145a and 145b, and the gate conductive layer may be patterned to form first and second gate dielectric patterns 146 and 147, and first and second gate electrodes 151 and 152. When the patterning process is performed, the buffer dielectric layer 141 may also be patterned to form first and second buffer dielectric layers 142 and 143. The first buffer dielectric layer 142, the first gate dielectric pattern 146 and the first gate electrode 151 may constitute a first gate structure 161 and the second buffer dielectric layer 143, the second gate dielectric pattern 147 and the second gate electrode 152 may constitute a second gate structure 162.

Referring back to FIG. 3, a semiconductor device according to an embodiment of the present invention is described. A portion of the descriptions described referring to FIGS. 1 through 3 may be omitted. A first structure 161 and a second structure 162 are disposed on a substrate 110. The substrate 110 may include a first region and a second region. One of the first and second regions may be a PMOS region and the other may be an NMOS region.

An active region 130 may be defined by a device isolation layer 120 in the substrate 110. The active region 130 may include a first active region and a second active region. One of the first and second active regions may include an n-type well and the other may include a p-type well. The first and second structures 161 and 162 may be disposed on the first and second active regions respectively.

The first gate structure 161 may include the first gate dielectric pattern 146 and the first gate electrode 151 and the second gate structure 162 may include the second gate dielectric pattern 147 and the second gate electrode 152. First and second buffer dielectric patterns 142 and 143 may be disposed between the first and second gate dielectric patterns 146 and 147 and the substrate 110 respectively.

The first and second gate dielectric patterns 146 and 147 may have different characteristics from each other. For example, a thickness of the first gate dielectric pattern 146 may be smaller than a thickness of the second gate dielectric pattern 147. An equivalent oxide thickness (EOT) of the first and second gate dielectric patterns 146 and 147 may be different from each other. An equivalent oxide thickness (EOT) of the first gate dielectric pattern 146 may be smaller than an equivalent oxide thickness (EOT) of the second gate dielectric pattern 147. Atomic ratios of elements included in the first and second gate dielectric patterns 146 and 147 may be different from each other. When the first and second gate dielectric patterns 146 and 147 are metal silicon oxynitride, a atomic ratio of metal element in the first gate dielectric pattern 146 may be higher than an atomic ratio of metal element in the second gate dielectric pattern 147. The first gate dielectric pattern 146 may further include fluorine (F).

A gate structure including the first and second gate dielectric patterns may have different threshold voltages by a difference between physical and/or electrical characteristics of the first and second gate dielectric patterns 146 and 147. Since physical thicknesses and/or electrical thicknesses of the first and second gate dielectric patterns 146 and 147 are different from each other, the first and second gate structures including first and second gate dielectric patterns 146 and 147 respectively may have different effective work functions from each other.

The first gate dielectric pattern 146 may function as a gate electrode. If an atomic ratio of metal element in the first gate dielectric pattern 146 is high enough to make the first gate dielectric pattern 146 conductive, the first gate dielectric pattern 146 may function as a gate electrode with a gate electrode. In this case, a first buffer dielectric layer 142 disposed between the first gate dielectric pattern 146 and the substrate 110 may function as a gate dielectric pattern. In this case, an effective work function of the first gate structure 161 may be determined according to the first gate dielectric pattern 146 and/or a work function of a gate electrode which will be described later.

A first gate electrode 151 and a second gate electrode 152 are disposed on the first and second gate dielectric patterns 146 and 147 respectively. The first and second gate electrodes 151 and 152 may be a conductive layer including doped polysilicon, metal or metal nitride. Threshold voltages of the first and second gate structures 161 and 162 including the first and second gate dielectric patterns 146 and 147, and the first and second gate electrodes 151 and 152 may be determined by thicknesses of the first and second gate dielectric patterns 146 and 147, work functions of the first and second gate electrodes 151 and 152 and/or an interface characteristic between the first and second gate dielectric patterns 146 and 147 and the first and second gate electrodes 151 and 152. Since the first gate dielectric pattern 146 and the second dielectric pattern 147 have different element atomic ratios from each other, an interface characteristic between the first and second gate dielectric patterns 146 and 147 and an interface characteristic between the first and second gate electrodes 151 and 152 may also be different. Accordingly, a gate structure 161 including the first gate dielectric pattern 146 and the first gate electrode 151 and a gate structure 162 including the second gate dielectric pattern 147 and the second gate electrode 152 may have different threshold voltages.

Figure 4:
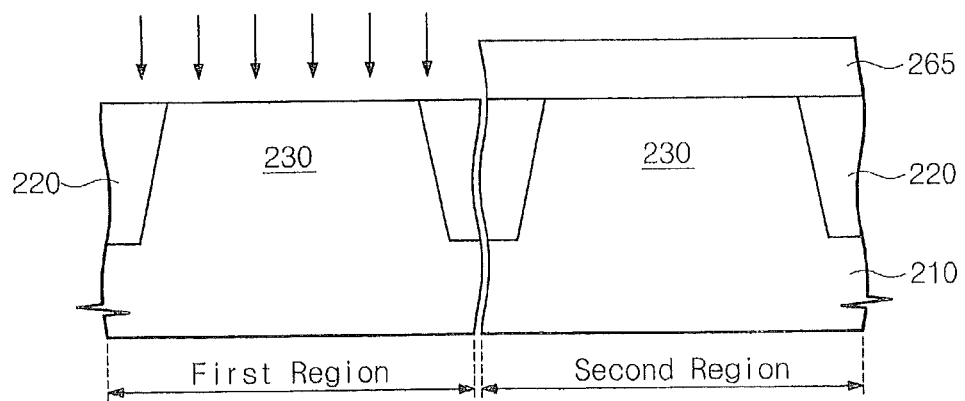
FIGS. 4 through 7 are drawings illustrating a method of forming a semiconductor device according to another embodiment of the present invention.

Referring to FIGS. 4 through 8, a method of forming a semiconductor device according to another embodiment of the present invention is described. Referring to FIG. 4, a substrate 210 including a first region and a second region is prepared. The first and second regions are divided by a device isolation layer 220 and may include active regions 230 respectively. One of the first and second regions may be a PMOS region and the other may be an NMOS region. The first and second active regions 230 may include a channel region.

A mask pattern 265 may be formed on the substrate 210. The mask pattern 265 may be formed on a portion of the substrate 210. For example, the mask pattern 165 may be formed on the active region 230 of the second region. A specific element may be injected into the exposed first region of the substrate 210. The specific element may be injected into a channel region of the first region.

The specific element may be material that is reactable with a portion of elements constituting a gate dielectric layer to be removed. For example, when the gate dielectric layer is a metal silicon oxide layer, the specific element may be element that can react to silicon and/or oxygen. The specific element may be injected into the channel region using a process such as an ion implantation, a plasma treatment or a cluster implantation. After injecting the specific element, the mask pattern 265 may be removed.

Figure 5:
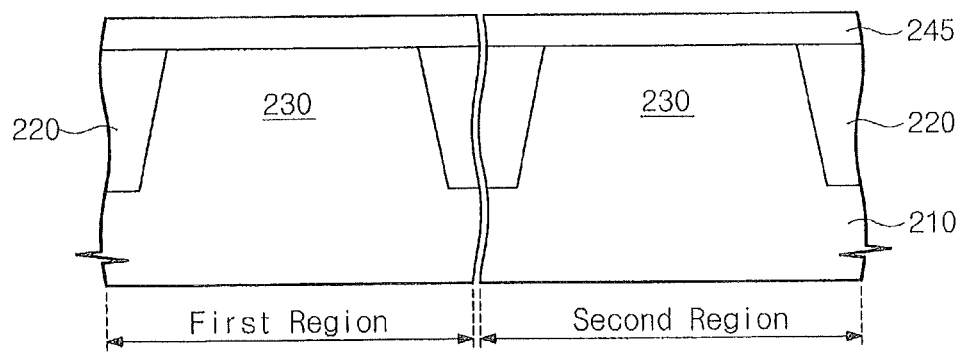

Referring to FIG. 5, a gate dielectric layer 245 is formed on the active region 230. The gate dielectric layer 245 may include a plurality of elements. At least one of a plurality of elements may react to the specific element. For example, the gate dielectric 245 may be a silicon oxide layer, a silicon nitride layer, a silicon oxynitride layer, a metal silicon oxide layer or a metal silicon oxynitride layer. For example, the gate dielectric layer 245 may be a hafnium silicon oxide layer or a hafnium silicon oxynitride layer. The gate dielectric layer 245 may be formed to be adjacent to a channel region where the specific element is injected. The gate dielectric layer 245 includes a first gate dielectric layer 245a formed on the first region and a second gate dielectric layer 245b formed on the second region.

When forming the gate dielectric layer 245, a specific element in the channel region may move into the first gate dielectric layer 245a. A movement of the specific element may occur by a heat during a formation of the gate dielectric layer 245. Alternatively after the gate dielectric layer 245 is formed, an annealing process is further performed so that the specific elements may move into the first gate dielectric layer 245a.

A movement of the specific element may be performed by an out diffusion of the specific element from the channel region. The specific element can be supplied to the first gate dielectric layer 245a by the out diffusion. As described above, since the specific element is supplied to the channel region of the first region, the specific element may be selectively supplied to the first gate dielectric layer 245a. The specific element may be substantially removed from the channel region. A portion of the specific elements may remain in the channel region.

Figure 6:
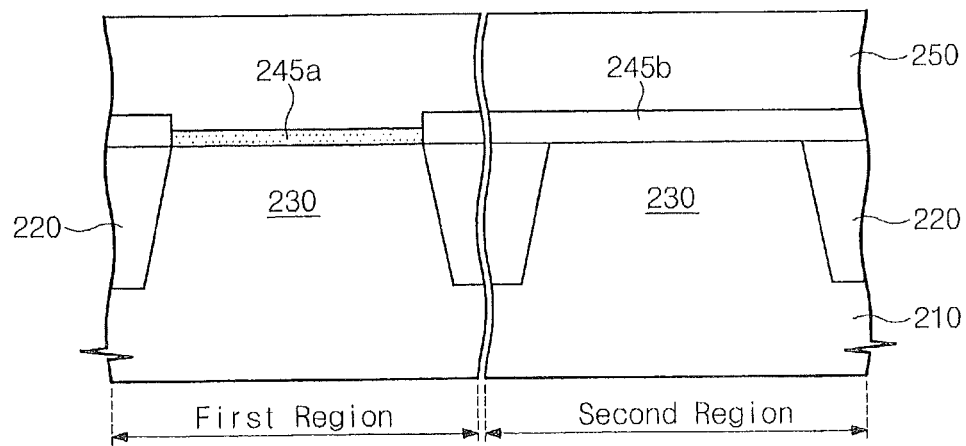

Referring to FIG. 6, the specific element reacts to at least one of a plurality of elements included in the first gate dielectric layer 245a to form a product. At this time, the formed product may be removed from the first gate dielectric layer 245a during a formation of the product and/or after the product is formed.

The specific element and the product formed by a reaction described above may be removed by an annealing process. The annealing process may be the annealing process described referring to FIG. 5 or include an additional annealing process. That is, after the product is formed by a heat supplied during an annealing process, the product is evaporated and removed from the first gate dielectric layer 245a. A process condition including a performance temperature and/or a pressure of the annealing process may be controlled depending on an evaporation point of the product. The product may be SiOF when the gate dielectric layer 245 is a metal silicon oxide layer and the specific element is fluorine (F).

As described above, the specific element may be removed from the first gate dielectric layer 245a in a form of being included in the product or in a form of a molecule consist of the specific elements. For example, when the specific element is fluorine (F), the fluorine (F) may be removed from the first gate dielectric layer 245a in a form of fluorine gas ($F_2$).

A characteristic of the first gate dielectric layer 245a may be changed by a removal of the product including the specific element from the first gate dielectric layer 245a. For example, a thickness of the first gate dielectric layer 245a may be reduced. Thus, the first gate dielectric layer 245a may have a thickness smaller than the second gate dielectric layer 245b. Atomic ratios of elements in the first gate dielectric layer 245a may be different from atomic ratios of elements in the second gate dielectric layer 245b. When the first and second gate dielectric layers 245a and 245b are metal silicon oxide layers, an atomic ratio of metal element in the first gate dielectric layer 245a may be higher than an atomic ratio of metal element in the second gate dielectric layer 245b. Accordingly, gate electrode structures including the first and second gate dielectric layers 245a and 245b may have different threshold voltages respectively. According to embodiments of the present invention, layers having different characteristics from each other may be formed by selectively changing a characteristic of a portion of one layer. Thus, process efficiency may be improved.

Figure 7:
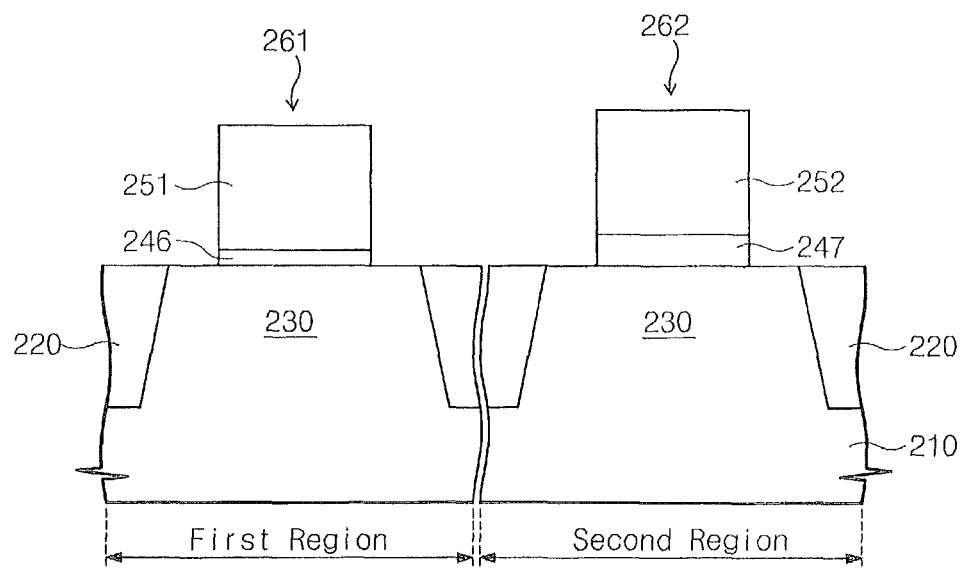

Referring to FIG. 7, a gate conductive layer 250 may be formed on the first and second gate dielectric layers 245a and 245b. The gate conductive layer 250 may include metal, metal compound or polysilicon doped with impurities. The first and second gate dielectric layers 245a and 245b are patterned to form a first gate dielectric pattern 246 and a first gate electrode 251, and a second gate dielectric pattern 247 and a second gate electrode 252. The first gate dielectric pattern 246 and the first gate electrode 251 may constitute a first gate structure 261 and the second gate dielectric pattern 247 and the second gate electrode 252 may constitute a second gate structure 262.

Referring back to FIG. 7, a semiconductor device according to another embodiment of the present invention is described. An active region 230 may be defined in a substrate 210 by a device isolation layer 220. The active region 230 may include an active region in a first region and an active region in a second region. One of the first and second regions may be a PMOS region and the other may be a NMOS region. For example, the first region may include an n-type well and the second region may include a p-type well. Also, the first region may include a p-type well and the second region may include an n-type well.

A first gate structure 261 and a second gate structure 262 are disposed on the first and second regions of the substrate 210 respectively. The first and second structures 261 and 262 may include gate dielectric patterns 246 and 247 and gate electrodes 251 and 252 respectively.

A first gate dielectric pattern 246 of the first gate structure 261 and a second gate dielectric pattern 247 of the second gate structure 262 may have different physical/electrical characteristics from each other. For example, the first gate dielectric pattern 246 may have a thickness smaller than the second gate dielectric pattern 247. The first and second gate dielectric patterns 246 and 247 may have different equivalent oxide layer thicknesses from each other. More specifically, an equivalent oxide layer thickness of the first gate dielectric pattern 246 may be smaller than an equivalent oxide layer thickness of the second gate dielectric pattern 247. Atomic ratios of elements in the first and second gate dielectric patterns 246 and 247 may be different from each other. When the first and second gate dielectric patterns 246 and 247 are metal silicon oxynitride layers, an atomic ratio of a metal element in the first gate dielectric pattern 246 may be higher than an atomic ratio of a metal element in the second gate dielectric pattern 247. The first gate dielectric pattern 246 may further include fluorine (F) element.

The first and second structures 261 and 262 may have different threshold voltages from each other by a difference of characteristics of the first and second gate dielectric patterns 246 and 247. That may be caused by a difference of physical and/or electrical thicknesses of the first and second gate dielectric patterns 246 and 247. Also, that may be caused by a difference of atomic ratios of elements in the first and second gate dielectric patterns 246 and 247. Since an interface characteristic between the first gate dielectric pattern 246 and the first gate electrode 251, and an interface characteristic between the second gate dielectric pattern 247 and the second gate electrode 252 are different from each other, effective work functions of the first and second gate electrodes 251 and 252 may be different from each other.

Figure 8:
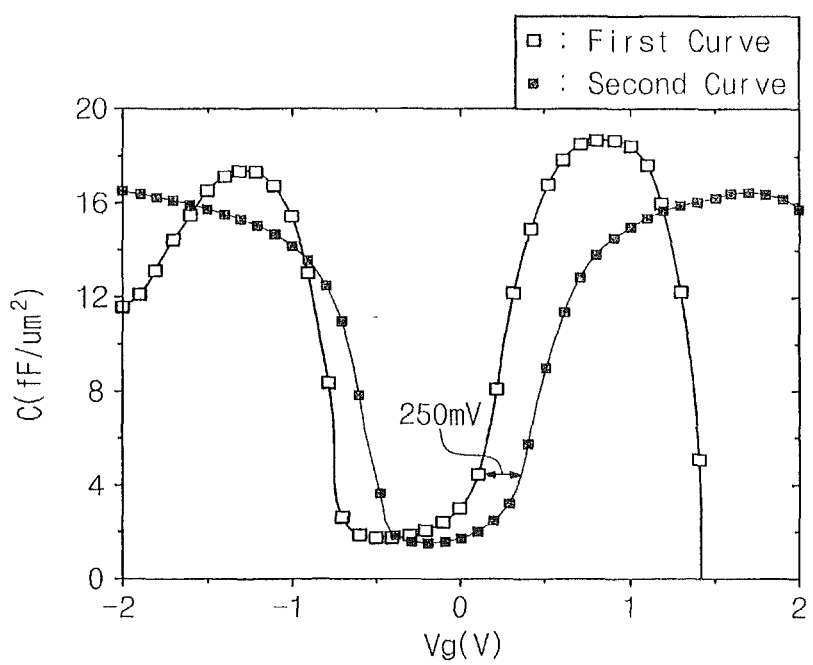
FIG. 8 is a drawing illustrating an effect according to embodiments of the present invention.

Referring to FIG. 8, an effect according to embodiments of the present invention is described. A graph depicted in FIG. 8 represents a relation between a capacitance and a voltage with respect to the first and second gate dielectric patterns formed according to embodiments of the present invention. The gate dielectric layer includes hafnium silicon oxynitride layer and the specific element includes fluorine. In the graph, an x axis represents a voltage (Vg) applied to a gate and a y axis represents capacitance. A first curve (-□-) represents a relation between a voltage and a capacitance of a gate structure including a first gate dielectric pattern formed by removing a product formed by a specific element after supplying the specific element. A second curve (-■-) represents a relation between a voltage and a capacitance of a gate structure including a second gate dielectric pattern to which the specific elements are not supplied. The first gate structure is disposed on a substrate of a PMOS region and the second gate structure is disposed on a substrate of an NMOS region.

Referring to the graph, a difference between a flat band voltage of the first gate structure and a flat band voltage of the second gate structure is about 250 mV. That may be caused by a difference of effective work functions of the first and second gate electrodes. Also, the first gate dielectric pattern has an equivalent oxide layer thickness of about 12 Å and the second gate dielectric pattern has an equivalent oxide layer thickness of about 17 Å. Accordingly, the gate structures including the gate electrodes and the gate dielectric patterns may have different threshold voltages from each other.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed:

1. A semiconductor device comprising:
   a substrate comprising first and second regions one of which is an NMOS region and the other of which is a PMOS region;
   a first gate electrode on the first region of the substrate;
   a first gate dielectric layer disposed on the first region between the substrate and the first gate electrode, wherein the first gate dielectric layer comprises fluorine; and
   a second gate dielectric layer and a second gate electrode disposed on the second region and wherein the first gate dielectric layer is thinner than the second gate dielectric layer.

2. The semiconductor device of claim 1, wherein the first and second gate dielectric layers include metal elements respectively and wherein atomic ratios of the metal elements are different in the first and second gate dielectric layers respectively.

3. The semiconductor device of claim 1, wherein the first and second gate dielectric layers comprise respective first and second metal silicon oxynitride layers.

4. The semiconductor device of claim 3 wherein an atomic ratio a metal in the first gate dielectric layer is greater than an atomic ratio a metal in the second gate dielectric layer.

5. The semiconductor device of claim 1, wherein the first and second gate dielectric layers provide respective different work functions.

6. The semiconductor device of claim 1, wherein the first and second gate dielectric layers provide respective different threshold voltages.

7. The semiconductor device of claim 1, wherein a difference between a flat band voltage of a first gate structure including the first gate electrode and a flat band voltage of a second gate structure including the second gate electrode is about 250mV.

8. The semiconductor device of claim 1, wherein the first gate dielectric layer has an equivalent oxide layer thickness of about 12Å and the second gate dielectric layer has an equivalent oxide layer thickness of about 17Å.

* * * * *